(12) United States Patent
Kang

(10) Patent No.: US 7,268,656 B2
(45) Date of Patent: Sep. 11, 2007

(54) VOLTAGE-CONTROLLED RECTIFIER FOR MOTOR VEHICLE

(76) Inventor: Chao-Hsi Kang, No. 18-5, Yu Cheng St., Nankang Dist, Taipei City (TW)

( * ) Notice: Subject to any disclaimer, the term of this patent is extended or adjusted under 35 U.S.C. 154(b) by 20 days.

(21) Appl. No.: 11/363,367

(22) Filed: Feb. 28, 2006

(65) Prior Publication Data

US 2007/0063806 A1  Mar. 22, 2007

(30) Foreign Application Priority Data

Sep. 20, 2005  (TW) .............................. 94216203 U

(51) Int. Cl.
*H01F 27/04* (2006.01)
(52) U.S. Cl. ...................................... 336/107; 336/192
(58) Field of Classification Search .................. 336/65, 336/83, 90, 107, 192, 200
See application file for complete search history.

(56) References Cited

U.S. PATENT DOCUMENTS 3,988,596 A * 10/1976 Minami et al. ............. 327/541

* cited by examiner

*Primary Examiner*—Tuyen T. Nguyen
(74) *Attorney, Agent, or Firm*—Birch, Stewart, Kolasch & Birch, LLP

(57) ABSTRACT

A voltage-controlled rectifier is disclosed to include a circuit board, which has a circuit electrically connected to the positive and negative terminals of the car battery of a car, a capacitor set formed of a plurality of capacitors connected in parallel to the circuit on the circuit board, and a rectifying unit, which has a connecting member and a winding eccentrically wound round the connecting member and electrically connected in series to the capacitor set.

5 Claims, 3 Drawing Sheets

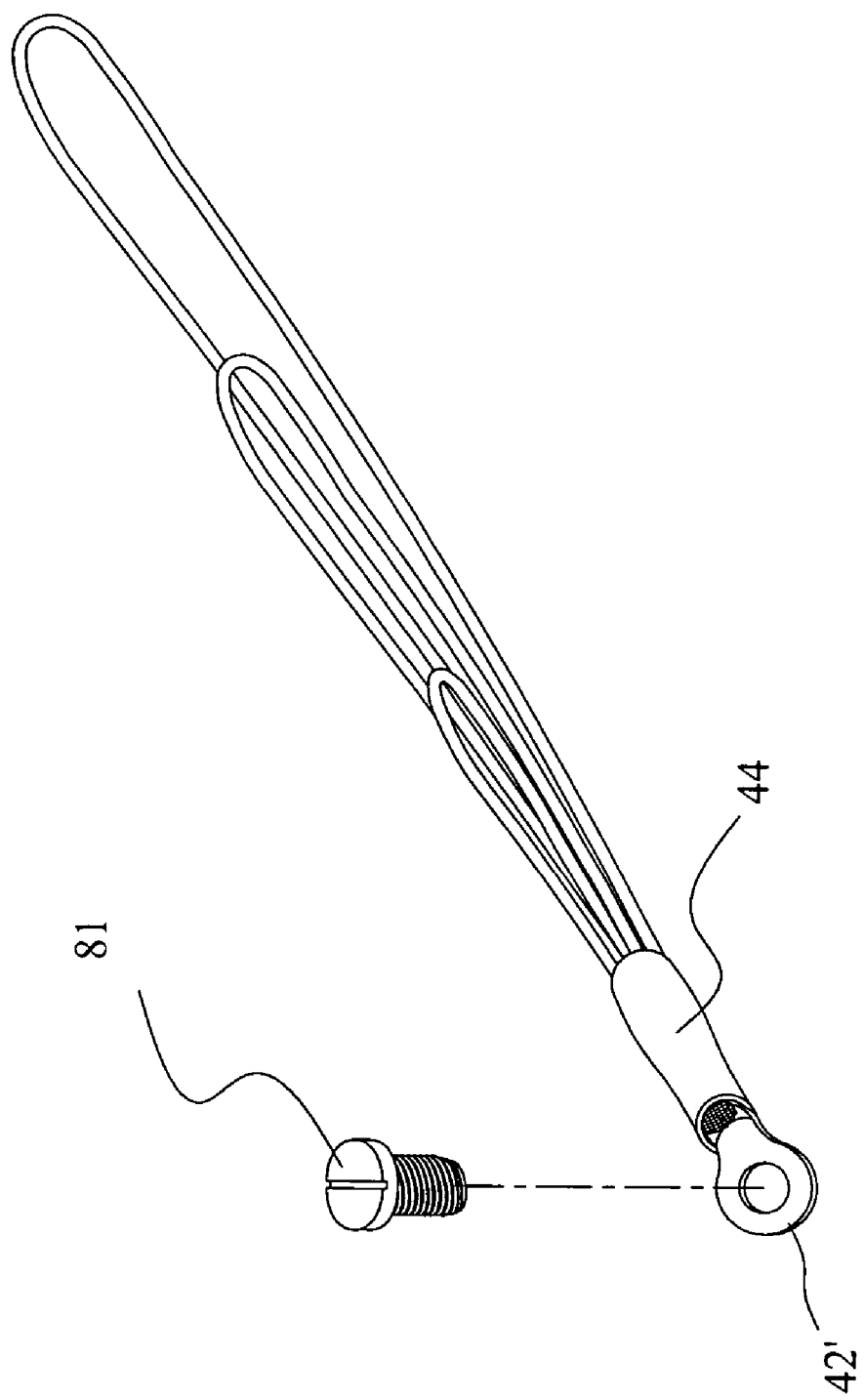

VOLTAGE-CONTROLLED RECTIFIER FOR MOTOR VEHICLE

BACKGROUND OF THE INVENTION

1. Field of the Invention

The present invention relates to a rectifier and more particularly, to a voltage-controlled rectifier for use in a motor vehicle.

2. Description of the Related Art

In a motor vehicle, the engine produces.

SUMMARY OF THE INVENTION

The present invention has been accomplished under the circumstances in view. It is the main object of the present invention to provide a voltage-controlled rectifier for motor vehicle, which effectively stabilizes the voltage and provides a stable electric current output, preventing damage to on-vehicle electric devices.

To achieve this and other objects of the present invention, the voltage-controlled rectifier is used in a motor vehicle and electrically connected to the positive and negative terminals of a car battery through two lead wires. The voltage-controlled rectifier comprises a circuit board, a capacitor set, and a rectifying unit. The circuit board has arranged thereon a circuit, which is electrically connected to the positive and negative terminals of the car battery. The capacitor set is installed in the circuit board and electrically coupled to the circuit of the circuit board, comprising at least one capacitor. The rectifying unit is installed in the circuit board, comprising a winding, and a connecting member securing the winding to the circuit board to keep the winding in connection to the capacitor set through the circuit of the circuit board.

BRIEF DESCRIPTION OF THE DRAWINGS

FIG. 3 is an exploded view of a part of an alternate form of the present invention, showing the structure of the rectifying unit.

DETAILED DESCRIPTION OF THE PREFERRED EMBODIMENT

Figure 1:
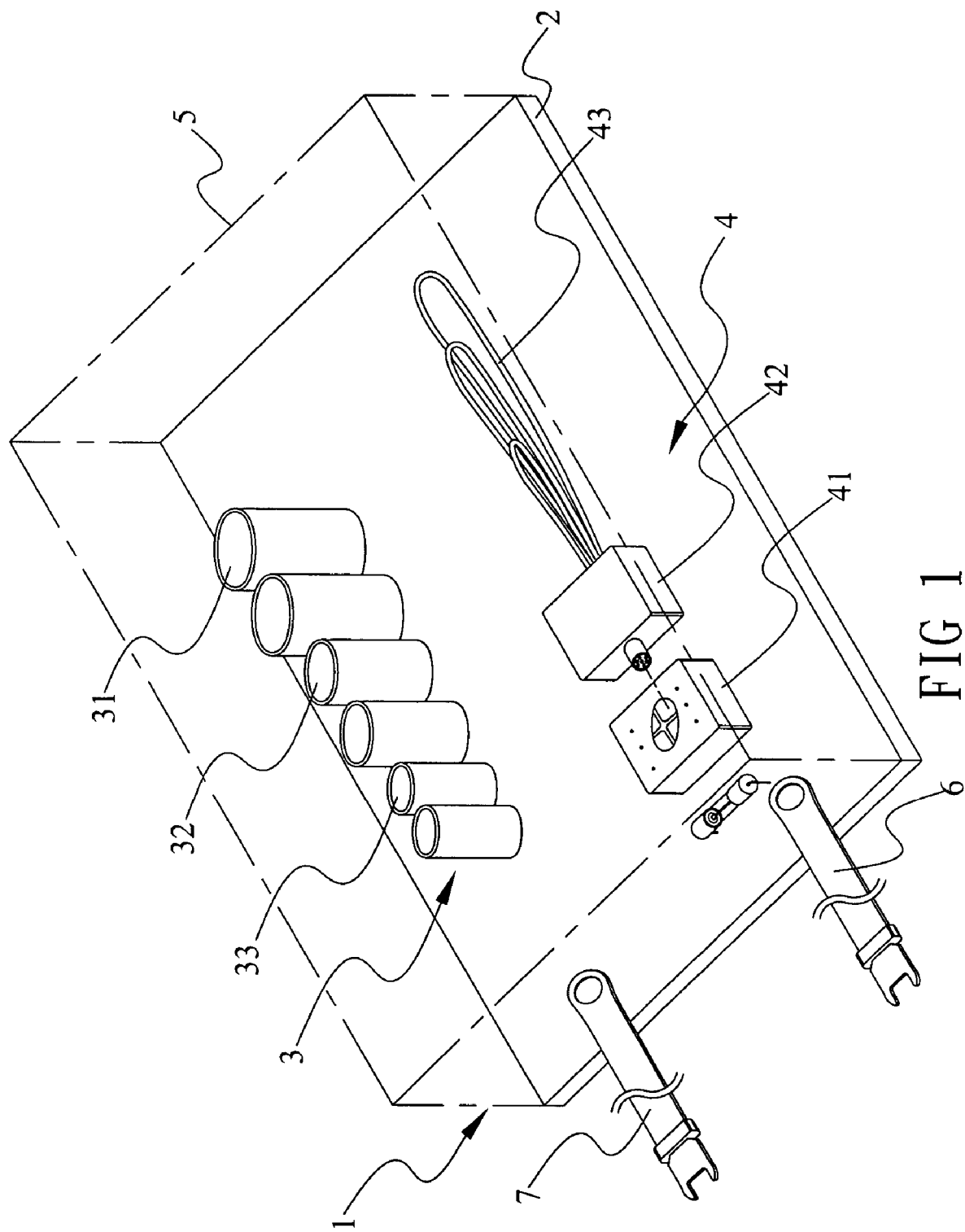
FIG. 1 is a perspective exploded view of a voltage-controlled rectifier according to the present invention.

Referring to FIG. 1, a voltage-controlled rectifier 1 in accordance with the present invention is shown comprising a circuit board 2, a capacitor set 3, a rectifier unit 4, and a housing 5 that houses the circuit board 2, the capacitor set 3, and the rectifying unit 4.

The circuit board 2 has arranged thereon a circuit (not shown), which is electrically connecteable to the positive and negative terminals of the car battery (not shown) through lead wires 6 and 7, thereby forming a loop. Because the circuit of the circuit board 2 is of the known art, no further detailed description in this regard is necessary.

The capacitor set 3 includes three pairs of capacitors 31, 32, and 33 arranged in parallel on the circuit board 2. These three pairs of capacitors 31, 32, and 33 have a different capacitance (farad value). Preferably, the capacitors over 400 farads are used. More capacitors may be used as a substitute.

The rectifying unit 4 comprises a catch 41, a connecting member 42, and a winding 43. The catch 41 is adhered or welded to the circuit board 2 at a suitable location, and electrically connected to the circuit on the circuit board 2. The connecting member 42 is shaped like a metal bump round which the winding 43 is wound eccentrically. According to this embodiment, the winding 43 wound round the connecting member 43 through three turns. The number of turns of the winding 43 corresponds to the number of pairs of capacitors of the capacitor set 3, i.e., increasing the number of pairs of capacitors of the capacitor set 3 must relatively increase the number of turns of the winding 43 round the connecting member 42. The winding 43 is formed of an enameled wire having 105 pieces of 0.12 mm copper wires. The connecting member 42 is detachably connected to the catch 41. By means of the catch 41, the connecting member 42 and the winding 43 are secured to the circuit board 2, forming a part of the loop.

Figure 2:
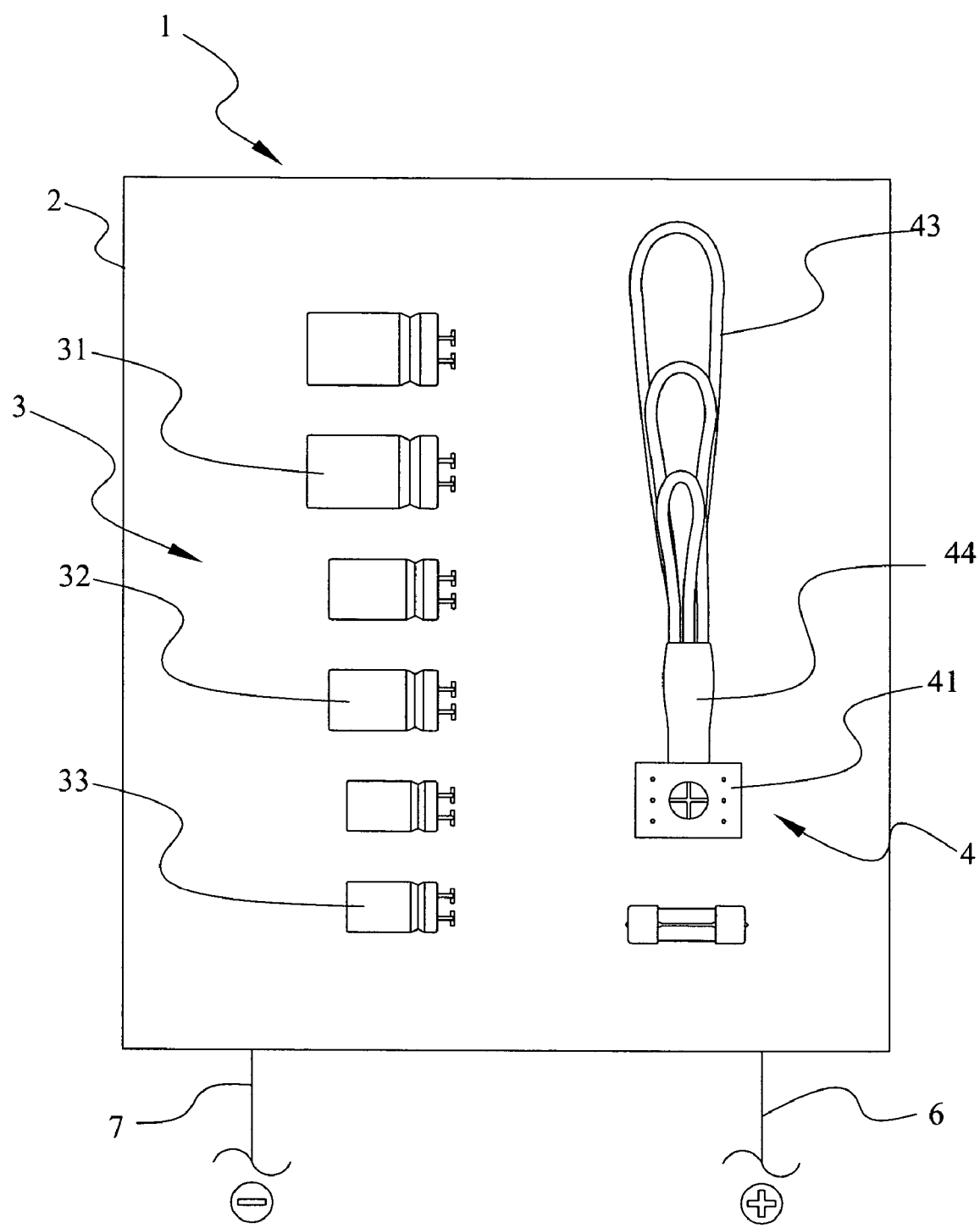
FIG. 2 is a top view of the voltage-controlled rectifier according to the present invention.

During operation of the engine of the car, the battery power of the car is not consumed. However, when the power consumption at the load is suddenly increased, the storage battery of the car must start a discharging compensation action, resulting in a transient lowering of the stability of the voltage. Referring to FIG. 2, output current from the storage battery of the car passes through the lead wire 6 to the voltage-controlled rectifier 1 of the present invention. Input current is then guided to the rectifying unit 4 by the circuit of the circuit board 2. By means of the effect of the magnetic field produced by the winding 43, the voltage of the input current is stabilized.

When the output power of the storage battery of the car is insufficient, the capacitor 31, 32, or 33 discharges rapidly to compensate the deficit. More particularly when the consumption of electric current is high (the accelerator is pressed heavily or the car is idling), the capacitor 31, 32, or 33 compensates the deficit, and the compensated electric current is then returned to the storage battery of the car through the lead wire 7.

Further, the winding 43 is formed of multiple thin copper wires, and a jacket 44 is used to held the winding 43 in the desired shape that has a great cross section to achieve the desired voltage stabilizing effect. The material of the lead wires and the connector used as well as heat isolation and anti-oxidation design affect the performance of the present invention in controlling the stability of the voltage.

Further, when electric current is guided into the winding 43, the variation of the magnetic field in the winding 43 causes a voltage-stabilized induction current. The capacitor 31, 32, or 33 is caused to discharge rapidly subject to the variation of the voltage. By means of the capacitor set 3 and the rectifying unit 4 on the circuit board 2, the invention keeps the storage battery in a stabilized status, eliminating the problem of unstable voltage/electric current. Further, the winding 43 is connected in series to the negative terminal of the capacitor set 3, achieving the desired wave filtration effect. Therefore, the supply of power from the storage battery of the car is stable, preventing damage to the electric device using the power of the storage battery.

According to the aforesaid embodiment, the connecting member 42 is connected to the circuit board 2 by the catch 41. In an alternate form as shown in FIG. 3, a screw 81 is used to substitute for the aforesaid ca 41, and the connecting member 42' is a lug that is fastened to the circuit board (not shown) by the screw 81.

While only one embodiment of the present invention has been illustrated and described, it will be understood that various modifications and enhancements can be made thereunto without departing from the spirit and scope of the invention.

What is claimed is:

1. A voltage-controlled rectifier used in a motor vehicle and electrically connected to the positive and negative terminals of a car battery through two lead wires, the voltage-controlled rectifier comprising:
   a circuit board, said circuit board having arranged thereon a circuit electrically connected to the positive and negative terminals of said car battery;
   a capacitor set installed in said circuit board and electrically coupled to the circuit of said circuit board, said capacitor set comprising at least one capacitor; and
   a rectifying unit installed in said circuit board, said rectifying unit comprising a winding, and a connecting member securing said winding to said circuit board to keep said winding in connection to said capacitor set through the circuit of said circuit board.

2. The voltage-controlled rectifier as claimed in claim 1, wherein said capacitor set comprises a plurality of capacitors connected in parallel.

3. The voltage-controlled rectifier as claimed in claim 1, wherein said rectifying unit further comprises a catch mounted on said circuit board and adapted to receive said connecting member.

4. The voltage-controlled rectifier as claimed in claim 1, wherein said connecting member is a lug; said winding is wound round said lug eccentrically.

5. The voltage-controlled rectifier as claimed in claim 1, wherein said capacitor set and said rectifying unit are electrically connected in series.

* * * * *